(12) United States Patent
Caneau et al.

(10) Patent No.: US 10,431,957 B2
(45) Date of Patent: Oct. 1, 2019

(54) MULTIWAVELENGTH QUANTUM CASCADE LASER VIA GROWTH OF DIFFERENT ACTIVE AND PASSIVE CORES

(71) Applicant: Thorlabs Quantum Electronics, Inc., Jessup, MD (US)

(72) Inventors: Catherine Genevieve Caneau, Corning, NY (US); Feng Xie, Painted Post, NY (US); Chung-En Zah, Holmdel, NJ (US)

(73) Assignee: THORLABS QUANTUM ELECTRONICS, INC., Jessup, MD (US)

( * ) Notice: Subject to any disclaimer, the term of this patent is extended or adjusted under 35 U.S.C. 154(b) by 0 days.

(21) Appl. No.: 15/449,388

(22) Filed: Mar. 3, 2017

(65) Prior Publication Data

US 2017/0179685 A1 Jun. 22, 2017

Related U.S. Application Data

(63) Continuation of application No. 14/725,789, filed on May 29, 2015, now Pat. No. 9,685,766, which is a
(Continued)

(51) Int. Cl.
*H01S 5/34* (2006.01)
*H01S 5/026* (2006.01)
(Continued)

(52) U.S. Cl.
CPC .......... *H01S 5/3402* (2013.01); *B82Y 20/00* (2013.01); *H01S 5/026* (2013.01); *H01S 5/0268* (2013.01);
(Continued)

(58) Field of Classification Search
CPC .... H01S 5/3401; H01S 5/0268; H01S 5/3425; G02B 6/102
(Continued)

(56) References Cited

U.S. PATENT DOCUMENTS 4,468,850 A * 9/1984 Liau ................... H01L 33/0025
257/E33.049
7,301,977 B2 * 11/2007 Fischer ................. B82Y 20/00
372/43.01
(Continued)

FOREIGN PATENT DOCUMENTS

| EP | 1 182758 | * | 3/2001 | ............... H01S 5/42 |
| EP | 1182758 A2 | | 2/2002 | |
| EP | 1863140 A1 | | 12/2007 | |

OTHER PUBLICATIONS

Tobias ("Widely tunable mid-infrared quantum cascade lasers using sampled grating reflectors"), Optics Express Oct. 8, 2012 | vol. 20, No. 21, p. 23339-23348.*
(Continued)

*Primary Examiner* — Tuan N Nguyen
(74) *Attorney, Agent, or Firm* — Myers Wolin, LLC

(57) ABSTRACT

Disclosed is a laser source capable of producing mid-IR laser radiation comprises growing a first core structure on a substrate, etching away the first core structure in one or more locations, and growing a second core structure on the substrate. At least one of the core structures comprises a quantum cascade gain medium emitting at a frequency within the range from 3-14 μm. Also disclosed is a laser source capable of producing mid-IR laser radiation comprising a quantum-cascade core positioned on a substrate for emitting within the range from 3-14 μm and a second core on the substrate positioned in-plane relative to the first core.
(Continued)

The second core is one of a) a passive waveguide core b) a second quantum-cascade core and c) a semiconductor active core region.

13 Claims, 4 Drawing Sheets

Related U.S. Application Data continuation of application No. PCT/US2013/072195, filed on Nov. 27, 2013.

(60) Provisional application No. 61/732,289, filed on Nov. 30, 2012.

(51) Int. Cl.
  *H01S 5/40* (2006.01)
  *H01S 5/343* (2006.01)
  *H01S 5/06* (2006.01)
  *H01S 5/125* (2006.01)
  *B82Y 20/00* (2011.01)
  *H01S 5/30* (2006.01)

(52) U.S. Cl.
  CPC ............ *H01S 5/0612* (2013.01); *H01S 5/305* (2013.01); *H01S 5/3434* (2013.01); *H01S 5/34313* (2013.01); *H01S 5/4068* (2013.01); *H01S 5/4087* (2013.01); *H01S 5/125* (2013.01)

(58) Field of Classification Search
  USPC .............................................. 372/45.012, 20
  See application file for complete search history.

(56) References Cited

U.S. PATENT DOCUMENTS

| | | | | |
|---|---|---|---|---|
| 8,879,595 | B2* | 11/2014 | Mawst | B82Y 20/00 372/43.01 |
| 2001/0033723 | A1* | 10/2001 | Yoo | B82Y 20/00 385/122 |
| 2003/0231686 | A1 | 12/2003 | Liu | |
| 2008/0043794 | A1* | 2/2008 | Botez | B82Y 20/00 372/45.01 |
| 2008/0304531 | A1* | 12/2008 | Mansour | B82Y 20/00 372/50.121 |
| 2009/0127570 | A1 | 5/2009 | Tamai et al. | |
| 2010/0111122 | A1* | 5/2010 | Pushkarsky | H01S 5/4012 372/32 |
| 2011/0080311 | A1* | 4/2011 | Pushkarsky | B82Y 20/00 342/14 |
| 2011/0090932 | A1* | 4/2011 | Park | B82Y 20/00 372/50.11 |
| 2012/0057254 | A1* | 3/2012 | Arnone | G02B 7/1824 359/872 |
| 2012/0236889 | A1 | 9/2012 | Caneau et al. | |
| 2012/0236890 | A1 | 9/2012 | Caneau et al. | |
| 2013/0136148 | A1 | 5/2013 | Caneau et al. | |

OTHER PUBLICATIONS

Chinese Notice of First Office Action and English translation of the first two pages, issued by the State Intellectual Property Office of the P.R.C. (SIPO), dated Jun. 1, 2017, for corresponding China application No. 201380067104.8.

International Search Report and Written Opinion dated Mar. 19, 2014 in corresponding International Application No. PCT/US2013/072195.

Wanke, Michael C., "Terahertz quantum cascade laser integration with on-chip micromachined rectangular waveguides," Proceedings of SPIE, vol. 7215, Feb. 9, 2009; p. 721504, XP55104850; San Jose, CA, US.

USPTO Non-Final Office action dated Jul. 8, 2016, for corresponding application No. 14/725,789.

International Preliminary Report on Patentability for corresponding International Application No. PCT/US2013/072195 dated Jun. 2, 2015.

"Bidirectional semiconductor laser", C. Gmachl et al, Nature 387, 777 (1999).

High-performance, homogeneous broad-gain QCLs based on dual-upper-state design, K. Fujita et al, Appl Phys Lett 96, 241107 (2010).

High-performance quantum cascade lasers with wide electroluminescence (~600 cm[sup-1]), operating in continuous-wave above 100° C., K. Fujita et al, Appl Phys Lett 98, 231102 (2011).

"Broadband Distributed-Feedback Quantum Cascade Laser Array Operating From 8.0 to 9.8 μm", B. G. Lee et al.

C. Gmachl, D. L. Sivco, R. Colombelli, F. Capasso and A. Y. Cho, "Ultra-broadband semiconductor laser," Nature, 415, 883-887, (2002).

C. Gmachl, D. L. Sivco, J. N., Baillargeon, A. L. Hutchinson, F. Capasso and A. Y. Cho, "Quantum cascade lasers with a heterogeneous cascade: two-wavelength operation," Appl. Phys. Lett., vol. 79, 572-574, 2001.

European First Examination Office Action for corresponding European Application No. 13 808 371.2 dated Mar. 28, 2017.

* cited by examiner

MULTIWAVELENGTH QUANTUM CASCADE LASER VIA GROWTH OF DIFFERENT ACTIVE AND PASSIVE CORES

CROSS-REFERENCE TO RELATED APPLICATIONS

This application is a continuation of U.S. patent application Ser. No. 14/725,789 filed on May 29, 2015, which is a continuation of International Application No. PCT/US2013/072195 filed on Nov. 27, 2013, which claims priority to U.S. Patent Application No. 61/732,289 filed on Nov. 30, 2012, the contents of each of which are incorporated herein by reference.

FIELD

The present specification generally relates to semiconductor-based lasers and, more specifically, to semiconductor-based lasers particularly for applications such as gas sensing, medical diagnostics, and other applications in which a multiplicity of different wavelengths or wide-range wavelength tuning is needed. Methods of making such devices are also disclosed.

TECHNICAL BACKGROUND

Generation of multiple wavelengths in the mid infra-red (MIR) from a quantum cascade lasers has been realized by designing one single core capable of emitting two wavelengths simultaneously (see "Bidirectional semiconductor laser", C. Gmachl et al, Nature 387, 777 (1999): one core designed such that opposite bias leads to emission of two different wavelengths), or by adding gratings with different periods to one single core with broad enough gain bandwidth. See, e.g., "High-performance, homogeneous broadgain QCLs based on dual-upper-state design", K. Fujita et al, Appl Phys Lett 96, 241107 (2010) and further work by the same group in Appl Phys Lett 98, 231102 (2011): one core which has a wide gain bandwidth and can be tuned to emit over a wide range of wavelengths (tuning range 330 cm-1 in the first work, 600 cm-1 in the second). See also "Broadband Distributed-Feedback Quantum Cascade Laser Array Operating From 8.0 to 9.8 µm", B. G. Lee et al: one broad-gain core, array of parallel devices whose exact wavelength is controlled by a grating. In these cases, the wavelength coverage is only about 15-20% of the center wavelength.

Another technique consists in stacking different cores on top of one another, each emitting at a different wavelength. See C. Gmachl, D. L. Sivco, R. Colombelli, F. Capasso and A. Y. Cho, "Ultra-broadband semiconductor laser," Nature, 415, 883-887, (2002) and C. Gmachl, D. L. Sivco, J. N., Baillargeon, A. L. Hutchinson, F. Capasso and A. Y. Cho, "Quantum cascade lasers with a heterogeneous cascade: two-wavelength operation," Appl. Phys. Lett., vol. 79, 572-574, 2001, Here again, gratings of different periods can be added above the core to select precise wavelengths, this time within a somewhat wider range due to the different cores (30-40% of the center wavelength).

SUMMARY

According to one aspect, of the present disclosure, a method of forming a laser source capable of producing mid-IR laser radiation comprises growing a first core structure on a substrate, etching away the first core structure in one or more locations, and growing a second core structure on the substrate. At least one of the core structures comprises a quantum cascade gain medium emitting at a frequency within the range from 3-14 µm.

According to another aspect, a laser source capable of producing mid-IR laser radiation comprises a quantum-cascade core positioned on a substrate for emitting within the range from 3-14 µm and a second core on the substrate positioned in-plane relative to the first core. The second core is one of a) a passive waveguide core b) a second quantum-cascade core structured for emitting at a frequency differing from that of the first core and c) a semiconductor active core region.

These and other features and advantages will be apparent from the specification and the drawings to those of skill in the art.

DETAILED DESCRIPTION

Figure 1A:
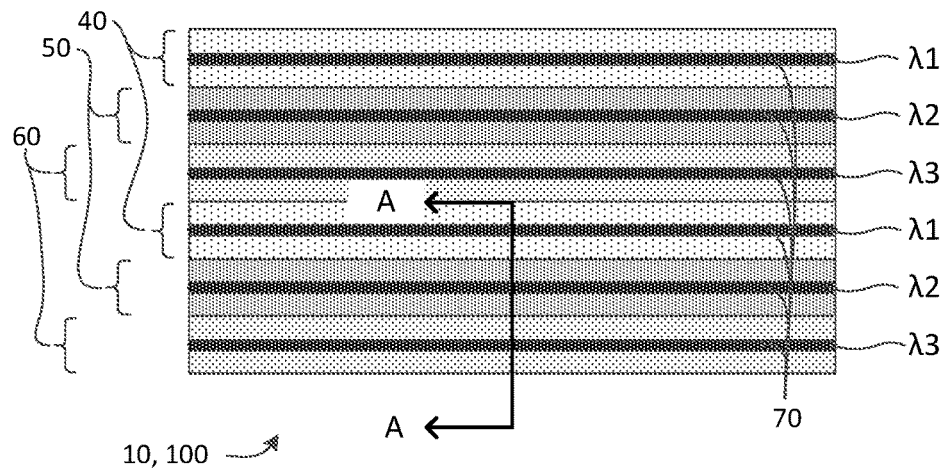
FIGS. 1A and 1B: Plan and cross-sectional schematic view of one embodiment of a multicore device according to the present disclosure.

The present invention can be understood more readily by reference to the following detailed description, drawings, examples, and claims, and their previous and following description. However, before the present compositions, articles, devices, and methods are disclosed and described, it is to be understood that this invention is not limited to the specific compositions, articles, devices, and methods disclosed unless otherwise specified, as such can, of course, vary. It is also to be understood that the terminology used herein is for the purpose of describing particular aspects only and is not intended to be limiting.

The following description of the invention is provided as an enabling teaching of the invention in its currently known embodiments. To this end, those skilled in the relevant art will recognize and appreciate that many changes can be made to the various aspects of the invention described herein, while still obtaining the beneficial results of the present invention. It will also be apparent that some of the desired benefits of the present invention can be obtained by selecting some of the features of the present invention without utilizing other features. Accordingly, those who work in the art will recognize that many modifications and adaptations to the present invention are possible and can even be desirable in certain circumstances and are a part of the present invention. Thus, the following description is provided as illustrative of the principles of the present invention and not in limitation thereof Disclosed are materials, compounds, compositions, and components that can be used for, can be used in conjunction with, can be used in preparation for, or are embodiments of the disclosed method and compositions. These and other materials are disclosed herein, and it is understood that when combinations, subsets, interactions, groups, etc. of these materials are disclosed that while specific reference of each various individual and collective combinations and permutation of these compounds may not be explicitly disclosed, each is specifically contemplated and described herein. Thus, if a class of substituents A, B, and C are disclosed as well as a class of substituents D, E, and F, and an example of a combination embodiment, A-D is disclosed, then each is individually and collectively contemplated. Thus, in this example, each of the combinations A-E, A-F, B-D, B-E, B-F, C-D, C-E, and C-F are specifically contemplated and should be considered disclosed from disclosure of A, B, and/or C; D, E, and/or F; and the example combination A-D. Likewise, any subset or combination of these is also specifically contemplated and disclosed. Thus, for example, the subgroup of A-E, B-F, and C-E are specifically contemplated and should be considered disclosed from disclosure of A, B, and/or C; D, E, and/or F; and the example combination A-D. This concept applies to all aspects of this disclosure including, but not limited to any components of the compositions and steps in methods of making and using the disclosed compositions. Thus, if there are a variety of additional steps that can be performed it is understood that each of these additional steps can be performed with any specific embodiment or combination of embodiments of the disclosed methods, and that each such combination is specifically contemplated and should be considered disclosed.

In this specification and in the claims which follow, reference will be made to a number of terms which shall be defined to have the following meanings:

"Include," "includes," or like terms means encompassing but not limited to, that is, inclusive and not exclusive.

The term "about" references all terms in the range unless otherwise stated. For example, about 1, 2, or 3 is equivalent to about 1, about 2, or about 3, and further comprises from about 1-3, from about 1-2, and from about 2-3, Specific and preferred values disclosed for compositions, components, ingredients, additives, and like aspects, and ranges thereof, are for illustration only; they do not exclude other defined values or other values within defined ranges. The compositions and methods of the disclosure include those having any value or any combination of the values, specific values, more specific values, and preferred values described herein.

The indefinite article "a" or "an" and its corresponding definite article "the" as used herein means at least one, or one or more, unless specified otherwise.

As used herein, a "superlattice" comprises at least two semiconductor materials with different bandgaps that produce quantum well confinement and interband or typically generally intersubband transitions (see, e.g., U.S. application Ser. No. 13/661,559, herein incorporated by reference in its entirety). The thicknesses of the at least two semiconductor materials may change within lattice or may be of constant thickness. If the thicknesses of the materials change, they may change in a linear or nonlinear fashion.

As used herein, a "stage" comprises a series of quantum wells formed by the superlattice that allow electrons to transition from an injector region to an active section, with the active section structured to induce lasing via one or more intersubband transitions. A particular stage structure generally lases within a quite narrow wavelength range. A stack comprises multiple stages arranged in a stacked configuration. As used herein, "heterogeneous quantum cascade" comprises a stack of multiple stages wherein the stages are not identical, that is, wherein there are at least two different stage structures each inducing lasing at differing center frequencies. The "active region" or "core" is comprised of at least one stack and is used to describe the region of the laser that produces the light emission.

At present, in order to increase the mid-IR optical gain bandwidth beyond that of a typical single quantum cascade core, multiple differing stages stacked in the growth direction, are proposed and demonstrated. A significant drawback of this approach is that the lasing efficiency at a given wavelength is low because only a part of the total stack contributes to the lasing.

As a method to overcome this barrier, a process is disclosed herein for forming multiple differing cores in the lateral direction, that is, multiple differing cores, in-plane relative to one another, within one wafer. Devices are also disclosed. A schematic depiction of one such device having such cores is shown in FIGS. 1A and 1B, while some steps of such a method are shown in FIG. 2.

Figure 1B:
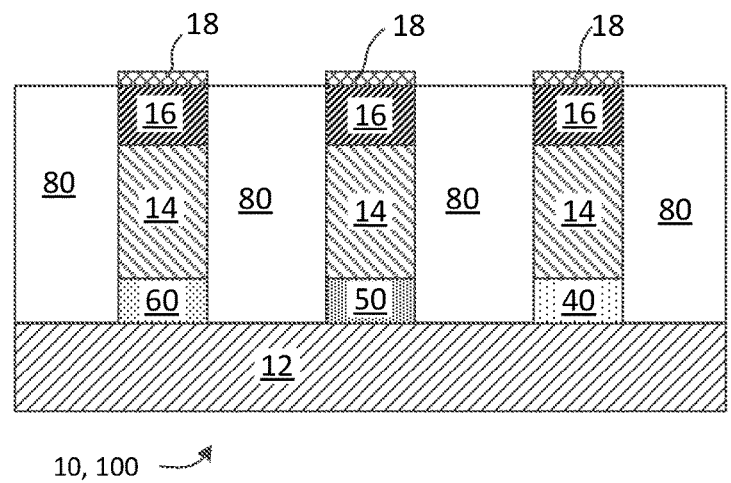

FIG. 1A is a schematic top or plan view looking down on a wafer 10 or laser source 100 as formed on wafer 10, from the top after the growth of three cores 40, 50, 60. Respective waveguides 70 are associated with each core. The respective cores are labeled $\lambda 1$, $\lambda 2$, and $\lambda 3$, to indicate that each is structured for generating a respective differing emission profile having respective differing center frequencies $\lambda 1$, $\lambda 2$, and $\lambda 3$. FIG. 1B is a schematic cross section of the structure of FIG. 1A, taken along A-A as indicated in FIG. 1A, showing the cores 40, 50, 60 on a substrate and lower cladding layer 12, with an upper cladding layer 14 above each core. A conductive layer 16 compatible with metallization may lie above the cladding layer, with respective metal contacts 18 formed thereon for current injection into the respective cores 40, 50, 60. At least one of the cores 40, 50 or 60, and in one alternative embodiment, two or all three of the cores 40, 50 and 60, are quantum-cascade type cores structured so as to produce center frequencies within the range from 3-14 µm. In another alternative embodiment, in addition to at least one core 40 of quantum-cascade type and structured so as to produce as center frequency within the range from 3-14 µgm, at least one of the other cores 50 or 60 is in the form of a semiconductor active core region structured for generating interband transitions emitting at a center frequency outside the range from 3-14 µm. Thus widely spaced wavelength sources may be integrated on the same substrate 12.

Figure 2:
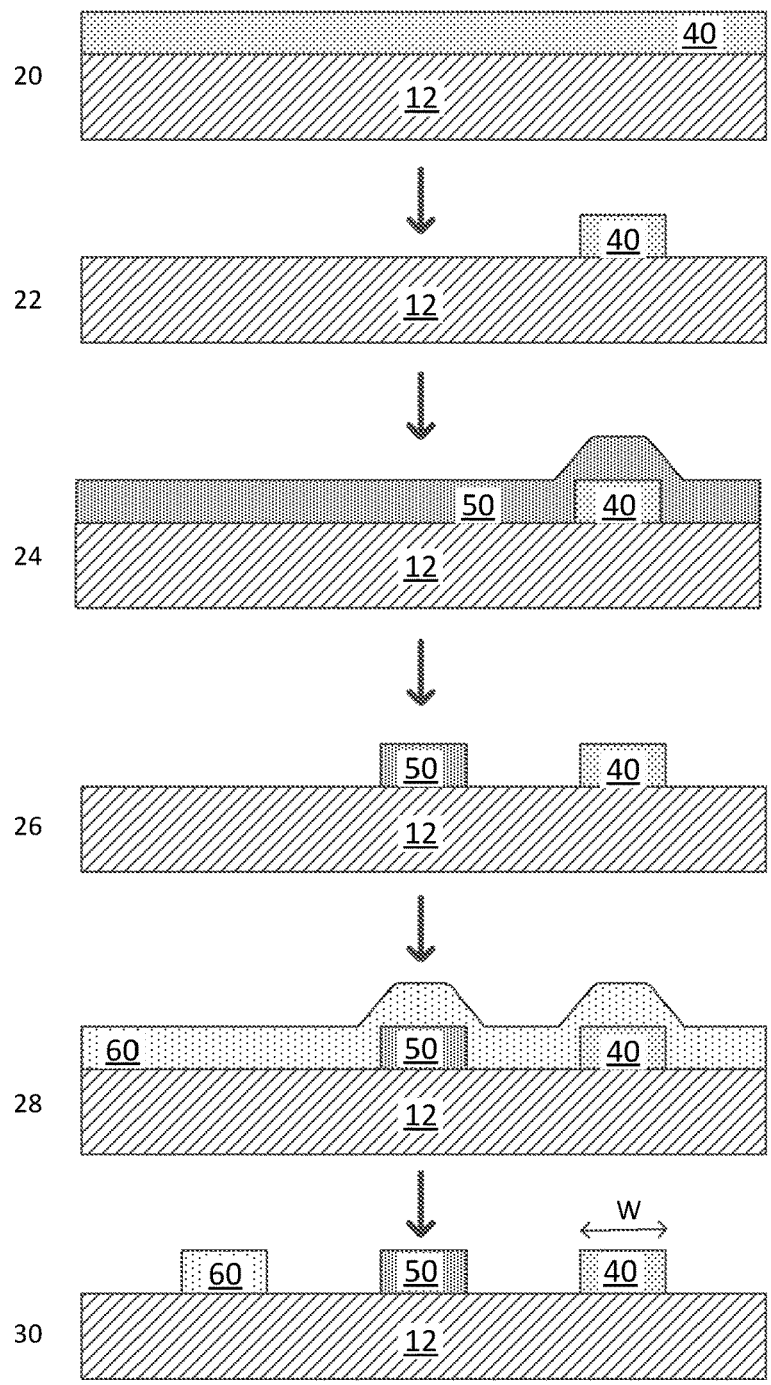
FIG. 2: Schematic of certain process steps in a method according to one embodiment of the present disclosure.

FIG. 2 shows a schematic illustration of certain process steps 20, 22, 24, 26, 28, and 30 according to one embodiment of a method of the present disclosure. As illustrated in FIG. 2, in a step 20, a first core structure 40 is grown and/or deposited (including by combinations of growth and deposition) on a substrate 12. In a step 22, the first core structure 40 is etched away in one or more location on the substrate, leaving at least one first core 40 as shown. In step 24, a second core structure 50 is grown and/or deposited on the substrate, and in step 26, the second core structure 50 is likewise etched away in one or more second locations on the substrate, leaving at least one second core 50 as shown. These steps may optionally be repeated further, with a third core structure 60 as shown in steps 28 and 30 deposited and then removed at one or more locations, leaving at least one third core 30 as shown. Each respective etch step may desirably take the form of a wet etch, although other suitable etch processes may be used. Each respective etch step may be used to remove all of the core structure overlying any previously deposited core, or, more preferably, if butt joints are to be used, a small overlying portion may be left, as will be explained below.

Because each core 40, 50, 60 is formed separately, this process allows the design of each core (both its material and structure) to be optimized to give high lasing efficiency and/or power at an assigned lasing wavelength. In embodiments, each of the assigned wavelengths are in the mid-IR wavelength region, and each core structure is in the form of a quantum cascade gain medium. Desirably, the width W of each core is chosen so that the corresponding laser frequency will lase in single lateral mode. As shown in the embodiment as shown in FIGS. 1A and 1B, the devices are desirably isolated from one another laterally by side regrowth of barrier layers 80, such as of InP layers, which both limits unwanted electrical current injection and provides optical confinement. Alternatively, deep-etched trenches (not shown) may be used for isolation in the lateral direction.

Figure 3A:
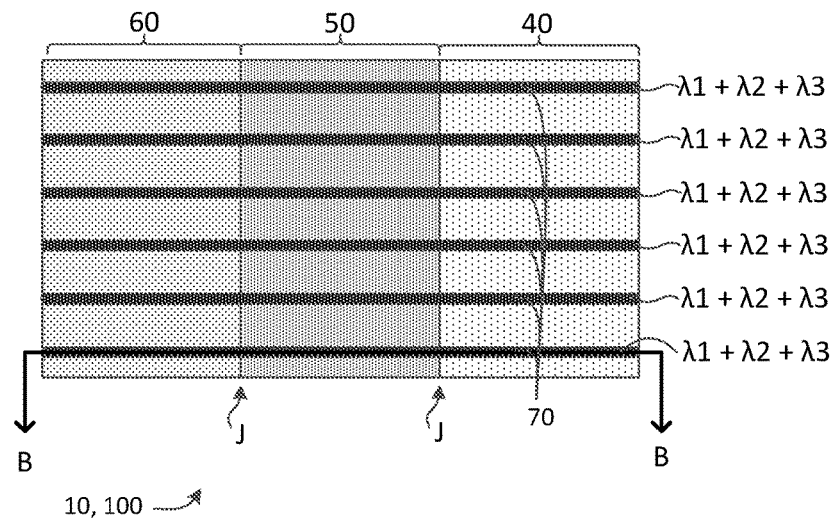
FIGS. 3A and 3B: Plan and cross-sectional schematic view of one alternative embodiment of a multicore device according to the present disclosure.
Figure 3B:
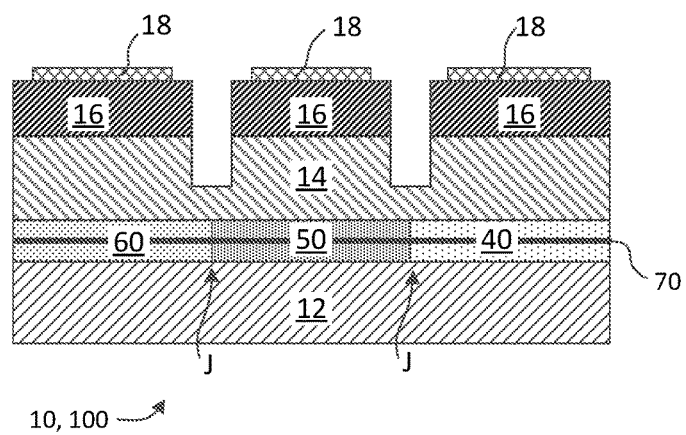

In the embodiment of FIGS. 1A and 1B, the multiple cores are positioned adjacent each other, side-by-side as part of separate respective waveguides 70. FIGS. 3A and 3B show another aspect in which multiple cores 40, 50, 60 are positioned adjacent each other end-to-end as part of common waveguides 70, desirably joined directly in respective butt joints J. FIG. 3A is a schematic plan view similar to that of FIG. 1A, while FIG. 3B is a schematic cross-section of the structure of FIG. 3A, taken along the line B-B indicated in FIG. 3A. The multiple cores 40, 50, 60 of this embodiment (three different cores in this instance) each compose part of each active device or waveguide, which will thus each emit, at the same time, one, two, or three wavelengths λ1, λ2, and λ3, depending on how each core is biased (how the metal contacts are supplied with voltage/current) at the time in question. The device of FIGS. 3A and 3B may desirably be laterally confined (not shown) in a manner similar to that shown in FIG. 1B above.

Desirably one of the cores 40 is a quantum-cascade core structured for generating intersubband transitions emitting at a first center frequency within the range from 3-14 m, and a second core 50 (or 60) is one of a) a passive waveguide core structured to guide wavelengths having said first center frequency, b) a second quantum-cascade core structured for generating intersubband transitions emitting at a second center frequency within the range from 3-14 μm different from said first center frequency, and c) a semiconductor active core region structured for generating interband transitions emitting at a second center frequency outside the range from 3-14 μm. The third core 60 (or 50) may further desirably be a quantum-cascade core structured for generating intersubband transitions emitting at a third center frequency within the range from 3-14 μm, different from said first center frequency and (if used) said second center frequency. Alternatively, the third core 60 (or 50) may be a passive waveguide core structured to guide wavelengths having said first and (if used) said second center frequencies. Such a third core is desirably positioned and arranged to form a waveguide multiplexer for the first (and alternatively also the second) waveguides.

As another alternative aspect, one (or more than one, should that ever be desirable) of the multiple cores 40, 50, 60 can be a passive core structured to be transparent to wavelengths emitted by one or more of the other cores, such as by a quantum cascade gain medium of one or more of the other cores. Candidate materials to form a low optical loss waveguide at mid-IR wavelength include AlInAs, InGaAs, GaInAsP, and AlGaInAs. The passive waveguides thus created can be arranged to serve as splitters or combiners, or multiplexers or demultiplexers to divide or combine light, in the form of one-to-many or many-to-one waveguide structures.

Where butt joints are employed, to ensure a smooth transition between the butt-joined cores, the second and any succeeding core growth steps are preferably performed with at least some portion of the previous core structure (with which a butt joint is to be formed) exposed—that is, with no mask layer or at least without a mask layer that covers every part of the top surface area of the previously patterned core(s). Substantially all the second or other succeeding core structure may then be removed from on top of the first core structure, such as by etching. Alternatively, and more desirably, a small portion P of the overlying second or other succeeding core structure may be allowed to remain to help ensure and preserve a robust butt joint. There desirably should be a small overlapped region (2-10 μm) to have good fabrication yield and negligible optical transition loss. Embodiments comprising such small portion P of overlapping core material are shown in FIGS. 4 and 5.

Figure 4:
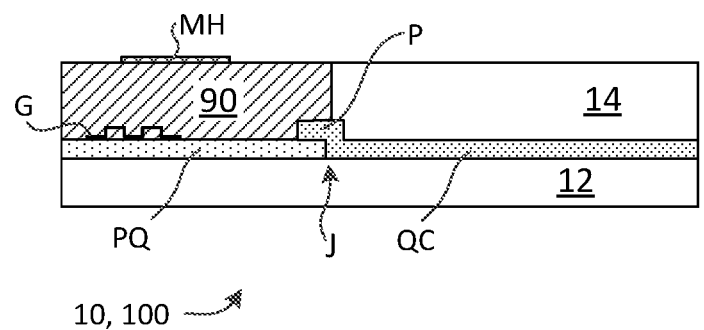
FIG. 4. Schematic cross-sectional view of one alternative aspect of certain embodiments of a device according to the present disclosure.
Figure 5:
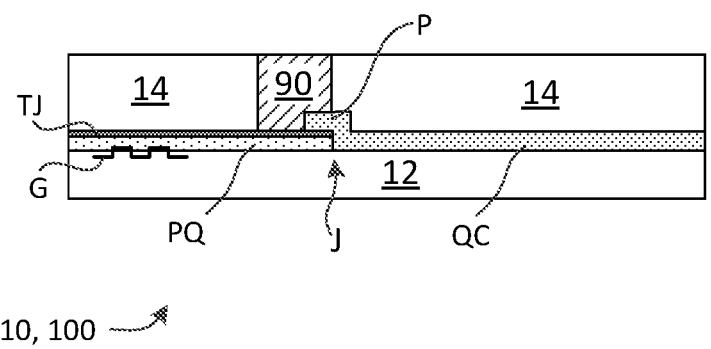
FIG. 5. Schematic cross-sectional view of another alternative aspect of certain embodiments of a device according to the present disclosure.

FIG. 4 shows a schematic cross-sectional elevation of a low loss passive quantum waveguide core PQ, desirably formed with GaInAsP, butt-joined with an active gain quantum cascade core QC, with a small overlap of the quantum cascade core over the passive core PQ to help ensure and preserve a robust butt joint. (It should be noted that the order of core growth need not be as implied by this structure—the passive core may be the second or other subsequently grown core, and the active core may be the second or other subsequently grown core.) As another alternative aspect, gratings G may be added above or below the passive core PQ to provide wavelength selective feedback. As a further alternative, one or more microheaters MH may be added on the top of an electrically insulating top cladding layer 90, such as SI-InP, to allow the microheater to selectively change the refractive index of the waveguide for wavelength tuning.

Across all embodiments, cladding layers are provided on both sides of the cores in the growth direction, with the bottom cladding layer desirably being n-doped, while the top cladding layer is n-doped where current injection is needed, but is semi-insulating wherever microheaters are positioned, if any, such as by being Fe-doped wherever microheaters are positioned, for example.

As another alternative aspect, a tunnel junction TJ can be added above or below the passive core, as shown (above in this instance) in the schematic cross section of FIG. 5, to inject minority carriers for changing the refractive index by the free carrier effect.

Methods of manufacturing may comprise using fabrication processes similar to those traditionally used in DFB QCLs. Embodiments herein are advantageous in that they can functionally replace tunable EC QCLs with a device having smaller size, faster speed and lower cost. Further, embodiments also have size and cost advantages over DFB QCL arrays, since DFB QCL arrays typically need combining optics to optically combine the output of an array into one optical beam.

Embodiments may comprise a gain material comprising at least two, compositionally non-identical, layers forming a superlattice. By proper design of the layer thicknesses, it is possible to engineer a population inversion between two subbands in the system which is necessary to achieve laser emission. The thickness of the layers may be identical or may be different depending on the desired design. In some embodiments, the layers have a thickness from about 1 A to about 500 Å. In some embodiments, the layers have a thickness from about 10 A to about 100 Å. In some embodiments, the layers have a thickness of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 35, 40, 45, 50, 55, 60, 70, 80, 90, 100, 125, 150, 175, 200, 250, 300, 350, 400, 450, or 500 Å.

Materials that may be used to form the layers in the gain material generally comprise semiconductors, such as group IV, III-V, and II-VI semiconductors. In some embodiments, the layers may comprise GaAs, $Al_xGa_{1-x}As$, $Si_xGe_{1-x}$, or $Ga_xIn_{1-x}As$ and $Al_yIn_{1-y}As$, wherein x and y are from 0 to 1.

The superlattice gain material may be produced using various techniques, for example molecular-beam epitaxy (MBE) (including gas-source MBE and MO-MBE), metalorganic vapor phase epitaxy (MOVPE), or sputtering. These methods allow production of layers with thicknesses of only a few atomic spacings.

Embodiments may further comprise an optical waveguide. An optical waveguide, as used herein, comprises a physical structure that guides electromagnetic waves in the optical spectrum. While not limited to any specific type of waveguide, one type of optical waveguide commonly used is a ridge waveguide. A ridge waveguide is created by etching parallel trenches in the quantum cascade gain material to create an isolated stripe of QC material, typically, but not necessarily, about 5-15 μm wide and several mm long (the length is usually defined by cleaving). Lateral mode confinement may be achieved by the deposition in the trenches of a dielectric material, and then the entire ridge is typically coated with gold to provide electrical contact and to help remove heat from the ridge when it is producing light. More commonly, lateral mode confinement is achieved by growing in the trenches a semi-insulating material such as InP if the laser was grown on InP substrate. Light is emitted from the cleaved ends of the waveguide.

Embodiments may further comprise an antireflection or antireflective (AR) layer. As used herein an AR layer comprises an optical coating applied to at least one end (facet) of the device and that reduces reflection, particularly in the IR region. The AR layers may be of any type, such as index-matching, single layer interference, multi-layer interference, or moth eye (nanostructured). In some embodiments, the AR coatings provide less than about 10%, 5%, 4%, 3%, 2%, 1%, 0.5%, 0.1%, 0.01%, 0.001%, or 0% loss.

Gratings can be patterned by electron beam ("e-beam") writing, contact printing of a grating mask, manufactured by e-beam lithography, or holography.

Additional components that may be found in embodiments comprise n-type cladding layers both above and/or below the gain material. The active gain and wavelength selective sections may be capped with a patterned electrical contact layer which comprises respective control electrodes dedicated to the different laser sections. An insulating dielectric material may be deposited in appropriate regions in the patterned electrical contact layer to isolate electrically the distinct regions of the laser structure.

In typical embodiments, the lasing sections are separated by a p-type electrical isolation region, as described in U.S. application Ser. No. 13/050,026, incorporated by reference herein in its entirety. For example, an active waveguide core may be sandwiched between upper and lower n-type cladding layers. The active core and the lower n-type cladding layer, as well as at least part of the upper cladding layer, extend through the electrically isolated laser sections of the embodiment. A portion or portions of the upper n-type cladding layer comprise sufficient p-type dopant to define p-type electrical isolation region(s), which extend across part of the thickness of the upper n-type cladding layer along a projection separating the sections of the embodiment. The upper and lower n-type cladding layers may comprise InP, GaAs, AlGaAs, or any other conventional or yet-to-be developed cladding material suitable. For example, and not by way of limitation, it is contemplated that a variety of cladding materials might be suitable, including II-VI semiconductors, Si—Ge or GaN-based materials, etc.

There are diverse ways of realizing the p-type isolation regions. Among these are selective growth, ion implantation, and diffusion of a p-type dopant. If the last option is chosen, the respective compositions of the upper and lower n-type cladding layers and the gain material may be selected to facilitate formation of the p-type electrical isolation regions by dopant diffusion. More specifically, the upper and lower n-type cladding layers may comprise InP and the p-type dopant may be selected such that its maximum stable concentration in the InP upper n-type cladding layer is below approximately $n \times 10^{18}$ cm$^{-3}$, where n is less than 3.

An alternative method of isolating the lasing sections comprises removal of the highly doped part of the n-cladding layer.

By way of example, and not limitation, it is alternatively contemplated that the upper and lower n-type cladding layers may be GaAs-based cladding layers. Some of the cladding layers may be AlGaAs or (Al)GaInP instead of simply GaAs or InP. For GaAs-based cladding layers, the core may be GaAs/AlGaAs, AlGaAs/AlGaAs, (Al)GaInP/(Al)GaInP, or GaInAs/(Al)GaAs. Additional layers of similar composition are contemplated for the remaining layers of the structure and should be selected to compensate for any lattice-mismatch between GaInAs and the GaAs substrate. For example, and not by way of limitation, other possible layers are GaInP, AlGaInP, GaAsP, and GaInAsP. For GaAs-based cladding layers, suitable dopants used to make (Al)GaAs semi-insulating include, but are not limited to Cr and O. At very low temperature growth, semi-insulating (Al)GaAs can be obtained without any dopant.

Embodiments herein are desirably used in a pulsed mode, but continuous-wave mode may be useful in some applications. Laser pulse duration may be from about 1 ns to about 1 ms. In some embodiments, the pulse width at FWHM is about 1 ns, 2 ns, 3 ns, 4 ns, 5 ns, 6 ns, 7 ns, 8 ns, 9 ns, 10 ns, 20 ns, 50 ns, 60 ns, 70 ns, 80 ns, 90 ns, 100 ns, 200 ns, 300 ns, 400 ns, 500 ns, 600 ns, 700 ns, 800 ns, 900 ns, 1 μs, 10 μs, 100 μs, or 1 ms. In some embodiments, devices embodied herein may be designed to fire all laser sections simultaneously, individually, and/or in a sequential or programmed order.

Embodiments may be used in any number of methods wherein IR radiation, and particular IR laser radiation would be advantageous. Particular applications include IR absorbance or reflectance measurements, IR and FTIR spectroscopies, Raman spectroscopy, gas and/or chemical weapons detection, chemical dynamics and kinetics measurements, thermal experiments, etc. In one embodiment, the embodiments are used in IR absorbance measurements to identify molecular compositions.

What is claimed is:

1. A laser source capable of producing mid-IR laser radiation, the source comprising:
    a first quantum-cascade core positioned on a substrate and having a first superlattice structured for generating intersubband transitions emitting at a first center frequency within the range from 3-14 μm; and
    a second core and a third core on the substrate and positioned in-plane relative to the first core,
    wherein the second core and third core are semiconductor active core regions having a second and a third superlattices different from the first core and structured for generating interband transitions emitting at a second and a third center frequencies, said second and third center frequencies being different from said first center frequency, wherein the substrate is an InP, GaAs or other group III-V material suitable for quantum-cascade lasers, wherein the first, second and third cores are grown separately, wherein the first, second and third cores are positioned adjacent each other side-by-side as part of separate respective first, second and third waveguides, and wherein the first, second and third cores are electrically and optically confined by either InP layers or deep-etched trenches in the lateral direction.

2. The laser source according to claim 1 further comprising cladding layers on both sides of the cores in the growth direction, with the bottom cladding layer being n-doped while the top cladding layer is n-doped or semi-insulating.

3. The laser source according to claim 2 wherein the semi-insulating top cladding layer is Fe doped.

4. A laser source capable of producing mid-IR laser radiation, the source comprising:

a first quantum-cascade core positioned on a substrate and having a first superlattice structured for generating intersubband transitions emitting at a first center frequency within the range from 3-14 μm; and a second core and a third core on the substrate and positioned in-plane relative to the first core, wherein the second core and third core are a second and a third quantum-cascade cores having a second and a third superlattices different from the first core and structured for generating intersubband transitions emitting at a second and a third center frequencies within the range from 3-14 μm different from said first center frequency, wherein the substrate is an InP, GaAs or other group III-V material suitable for quantum-cascade lasers, wherein the first, second and third cores are grown separately, wherein the first, second and third cores are positioned adjacent each other end-to-end as part of a common waveguide, and wherein the first, second and third cores are electrically and optically confined by either InP layers or deep-etched trenches in the lateral direction.

5. The laser source accord to claim 4 wherein the first, second and third cores are butt-joined one to another.

6. The laser source according to claim 4 further comprising cladding layers on both sides of the cores in the growth direction, with the bottom cladding layer being n-doped while the top cladding layer is n-doped or semi-insulating.

7. The laser source according to claim 6 wherein the semi-insulating top cladding layer is Fe doped.

8. A laser source capable of producing mid-IR laser radiation, the source comprising:

a first quantum-cascade core positioned on a substrate and structured for generating intersubband transitions emitting at a first center frequency within the range from 3-14 μm; and a second core and a third core on the substrate and positioned in-plane relative to the first core, wherein (a) the second and cores are passive waveguide cores made comprising one of AlInAs, InGaAs, GaInAsP, or AlGaInAs, and structured to guide wavelengths having said first center frequency, or (b) one of the second and third cores is a semiconductor active core region having a second superlattice different from the first core and structured for generating intersubband transitions emitting at a second center frequency different from said first center frequency, and the other one of the second and third cores is a passive waveguide core made comprising one of AlInAs, InGaAs, GaInAsP, or AlGaInAs, and structured to guide wavelengths having said first and second center frequencies;

wherein the substrate is an InP, GaAs or other group III-V material suitable for quantum-cascade lasers, wherein the first, second and third cores are grown separately, wherein the first, second and third cores are positioned adjacent each other end-to-end as part of a common waveguide, and wherein each gain or passive section is electrically isolated from the neighboring sections by either InP layers or etched-trenches above the core in the isolated region between the neighboring sections.

9. The laser source according to claim 8 further comprising a grating above or below the passive core.

10. The laser source according to claim 9 further comprising microheaters above the passive core for tuning the grating.

11. The laser source according to claim 9 further comprising a tunnel junction above or below the passive core for minority carrier injection into the passive core.

12. The laser source according to claim 8 further comprising cladding layers on both sides of the cores in the growth direction, with the bottom cladding layer being n-doped while the top cladding layer is n-doped or semi-insulating.

13. The laser source according to claim 12 wherein the semi-insulating top cladding layer is Fe doped.

* * * * *